United States Patent
Duvanenko

(10) Patent No.: US 9,433,078 B2
(45) Date of Patent: Aug. 30, 2016

(54) PRINTED CIRCUIT BOARDS WITH EMBEDDED ELECTRO-OPTICAL PASSIVE ELEMENT FOR HIGHER BANDWIDTH TRANSMISSION

(71) Applicant: SANMINA CORPORATION, San Jose, CA (US)

(72) Inventor: Vladimir Duvanenko, San Jose, CA (US)

(73) Assignee: SANMINA CORPORATION, San Jose, CA (US)

( * ) Notice: Subject to any disclaimer, the term of this patent is extended or adjusted under 35 U.S.C. 154(b) by 206 days.

(21) Appl. No.: 13/673,986

(22) Filed: Nov. 9, 2012

(65) Prior Publication Data

US 2013/0112465 A1    May 9, 2013

Related U.S. Application Data

(60) Provisional application No. 61/557,883, filed on Nov. 9, 2011.

(51) Int. Cl.
| | |
|---|---|
| *H05K 1/16* | (2006.01) |
| *H05K 1/02* | (2006.01) |
| *H05K 1/18* | (2006.01) |

(Continued)

(52) U.S. Cl.
CPC .......... *H05K 1/0216* (2013.01); *H05K 1/0251* (2013.01); *H05K 1/182* (2013.01); *H05K 3/00* (2013.01); *H05K 1/0245* (2013.01); *H05K 1/116* (2013.01); *H05K 2201/09781* (2013.01); *Y10T 29/49146* (2015.01)

(58) Field of Classification Search
CPC .. H05K 1/0216; H05K 1/0251; H05K 1/182; H05K 1/023; H05K 1/0246; H05K 2201/09809; H05K 2201/0317; H05K 1/167
See application file for complete search history.

(56) References Cited

U.S. PATENT DOCUMENTS 6,521,843 B1 * 2/2003 Kohya .......................... 174/255
7,375,290 B1    5/2008 Kwark et al.

(Continued)

FOREIGN PATENT DOCUMENTS

WO    2009/023238 A1    2/2009

OTHER PUBLICATIONS

Extended European Search Report for EP Application No. 12847074.7 dated Jun. 19, 2015; 7 pages.

*Primary Examiner* — Steven T Sawyer
(74) *Attorney, Agent, or Firm* — Loza & Loza, LLP; Julio M. Loza

(57) ABSTRACT

A printed circuit board (PCB) is provided comprising a plurality of non-conductive layers with conductive or signal layers in between. The PCB includes a first conductive via traversing the plurality of non-conductive and conductive or signal layers as well as a second conductive via traversing the plurality of non-conductive layers and conductive or signal layers, the second conductive via located substantially parallel to the first conductive via. An embedded electro-optical passive element is also provided that extends perpendicular to and between the first conductive via and the second conductive via. The electro-optical passive element embedded is located within a selected layer at a first depth in the printed circuit board, wherein such first depth is selected to reflect an incident electromagnetic wave back into the printed circuit board to enhance or diminish an electrical signal in the first conductive via by creating a positive or negative electromagnetic interference.

21 Claims, 18 Drawing Sheets

(51) Int. Cl.
*H05K 3/00* (2006.01)
*H05K 1/11* (2006.01)

(56) References Cited

U.S. PATENT DOCUMENTS

| | | |
|---|---|---|
| 7,897,880 B1 | 3/2011 | Goergen et al. |
| 2005/0231927 A1* | 10/2005 | Masuyama et al. .......... 361/783 |
| 2006/0094156 A1* | 5/2006 | Lai et al. ...................... 438/106 |
| 2006/0151205 A1 | 7/2006 | Lim |
| 2007/0091581 A1* | 4/2007 | Gisin et al. ................... 361/782 |
| 2007/0130555 A1* | 6/2007 | Osaka ............... H01L 23/49838 439/14 |
| 2008/0017411 A1* | 1/2008 | Chen ............................ 174/262 |
| 2008/0049410 A1* | 2/2008 | Kawaguchi et al. ......... 361/818 |
| 2008/0308313 A1 | 12/2008 | Gorcea |
| 2009/0045889 A1* | 2/2009 | Goergen et al. .............. 333/175 |
| 2010/0208440 A1* | 8/2010 | Peiffer et al. ................. 361/763 |
| 2010/0314163 A1 | 12/2010 | Twardy et al. |
| 2010/0319980 A1 | 12/2010 | Kim et al. |
| 2011/0094786 A1 | 4/2011 | Liu et al. |

* cited by examiner

FIG. 1 *(Prior Art)*

PRINTED CIRCUIT BOARDS WITH EMBEDDED ELECTRO-OPTICAL PASSIVE ELEMENT FOR HIGHER BANDWIDTH TRANSMISSION

CLAIM OF PRIORITY

The present application for patent claims priority to U.S. Provisional Application No. 61/557,883 filed Nov. 9, 2011, which is hereby expressly incorporated by reference.

BACKGROUND

1. Field

Various features relate to multilayered printed circuit boards and more specifically to using embedded electro-optical passive elements to reduce electromagnetic interference, improve signal loss, and adjust, remove, or minimize frequency response notches at a frequency band of interest.

2. Background

High speed signal transmissions in printed circuit boards (PCBs) have an inherent impedance mismatch between the various components of the PCB, such as plated through holes or vias, signal traces and open propagation mediums. The impedance mismatches cause a significant impediment to obtaining lower loss and flat data transmission in high data rate (i.e. 8 to 25+ Giga bits per second) protocols such as Peripheral Component Interconnect Express (PCI-Ex), Gen 3, Institute of Electrical and Electronics Engineers (IEEE) 802.3ba, and Optical Interconnect Forum (OIF) Common Electrical Interface (CEI) 25G Long Reach (LR) standards. Some of these designs require high number of layers and a relatively thick PCB construction with long vias used to route signals between various layers in the PCB. These vias yield significant undesirable interference due to large electromagnetic reflections for the unused portion of an interconnection via back onto the signal line. Typically, to circumvent this undesirable interference, the unused stub of the via is back drilled up to near the signal layer.

FIG. 1 illustrates a via channel having an open-ended stub located within a PCB. The PCB 102 may include a plurality of non-conductive layers 104 (e.g., dielectric layers) with conductive layers 106 (e.g., reference/ground layers and/or signal layers) in between. Open-ended paired vias 108 and 110 may traverse the plurality of PCB layers. The open-ended paired vias may include a signal via 108 and a reference/ground via 110. The signal via 108 may be coupled to a first signal trace 103 (on a top side of the PCB 102) and a second signal trace on the signal layer 106. The reference/ground via 110 may be coupled to a reference/ground layer 107.

A via channel 100 comprises primarily a dielectric medium bounded by current carrying rails (via barrels 108 and 110). The via channel 100 is a region across the thickness of the PCB 102 that is made up primarily of the non-conductive layers (e.g., dielectric material) of the PCB 102 but also includes thin signal layers and/or conductive layers (e.g., typically thin or foil signal layers and/or conductive layers). The current carrying rails may include the signal via 108 and the reference/return via 110. A source current 120, 120' and 120" flowing through the signal via 108 and reference/return via 110 may provide a quasi-transverse electromagnetic (TEM) propagation mode for an electromagnetic wave, e.g. resulting from a source signal 105 (e.g., a high frequency signal, such as 5 GHz signal to 25 GHz or higher) flowing through the vias 108 and 110. The bulk of the signal energy propagates inside the dielectric medium (e.g., across the thickness of the PCB non-conductive, signal, and conductive layers between vias 108 and 110) and through gaps (antipads) isolating signal vias from ground/reference layers and other signal layers. While FIG. 1 illustrates a simplified case with one reference/ground via 110, other designs may also include a plurality of reference/ground vias.

One negative effect of the forward electromagnetic wave 112 is that it is reflected off of the open-ended via stub in an uncontrolled manner, including dissipation/propagation from the end point 116 of the signal via 108 and/or reflecting back into to PCB 102 that causes interference with the signal 105. For example, in a typical uncontrolled reflection, the total signal may be diminished up to 20 dB, for example, in a critical area of the 1st and 3rd harmonics. The transmission line dielectric medium (e.g., the via channel 100) and the conductive vias 108 and 110 may have significant losses in the multi-GHz frequency band, for example, and as a result it is not practical to use additional absorption and dissipation techniques as the additional loss uses too much of the signal noise budget.

FIG. 2 illustrates a typical S21 attenuation pattern 202 for a transmission line with an open ended plated through hole via. As shown, at the first and third harmonics for PCI Ex, Gen 3 and IEEE 802.3ba standards, significant interference notches 204 and 206 are present at critical frequencies (e.g., between 4.0 and 5.0 GHz, and between 12.0 and 15.0 GHz). The deep notch 204 near the first harmonic is primarily due to the open ended via stub reflections. A second deeper notch 206 is located in the region near the third harmonics with additional attenuation effects due to the higher dielectric and copper losses at these higher frequencies.

The current approach to circumvent this undesirable interference (e.g., notches at particular frequencies) is to back drill the vias. FIG. 3 illustrates the via channel of FIG. 1 where the vias have been back drilled within the PCB. However, this is an unsatisfactory solution.

FIG. 4 illustrates a S21 attenuation pattern 402 for a transmission line structure similar to FIG. 3 with the stubs of the paired via back drilled. Back drilling involves removing an unused part of a via by drilling it so that conductive plating is removed. Although via back drilling removes the notch (caused by the reflected electromagnetic wave) in the region of the first harmonics, it may also create a new and more harmful notch 304 near the region of the third harmonics. The placement of the notch 304 may depend, at least partially, on the PCB laminate electrical properties and physical PCB design attributes. The back drilled vias relocate the interference notch along the frequency axis into a critical region of the third harmonics. Although the back drilled vias have a positive effect of transmission bandwidth improvements at the lower frequencies because the unused via section is removed, the improvement is limited at higher frequencies, or may actually move the interference notch to a higher frequency.

Consequently, a more effective way of reducing undesirable interference notches due to the use of vias is needed. At present time there are two general approaches to solve this issue. A first approach includes the placement some terminating element on an opened end via (circuit) stub. A second approach includes using optic acrylic waveguides embedded in regular PCB structure to increase bandwidth and avoid back drilling the via. Both of these approaches method.

A first prior art approach is presented in U.S. Pat. Nos. 5,161,086, 6,593,535, and 7,457,132. In this approach, absorption and dissipation of an incident electromagnetic wave is achieved by using a terminating element. However, with increasing of data rates, losses in non-conductive layers (e.g., dielectric material) and conductive/signal layers of the PCB also increase drastically, significantly restricting the bandwidth and length of PCB transmission lines. Consequently, this approach is not practical to use additional absorption and dissipation techniques as the additional loss uses too much of the signal noise budget.

In a second prior art approach, acrylic waveguides may be embedded or included in the PCB, but this is relatively expensive and suffers from unresolved problem, such as the optical connection of the backplane, middle plane with daughter cards. Additionally, this approach requires electrical-to-optical and optical-to-conversion interfaces/couplers with thousands times frequency scaling. The relatively high cost of implementing this approach and energy consumption make this approach undesirable.

Consequently, there is a need for a solution that addresses the shortcomings of the prior art while improving signal propagation within via structures of a laminate-copper PCB.

SUMMARY

A printed circuit board (PCB) is provided comprising a plurality of non-conductive layers with conductive or signal layers in between. The PCB includes a first conductive via traversing the plurality of non-conductive and conductive or signal layers as well as a second conductive via traversing the plurality of non-conductive layers and conductive or signal layers, the second conductive via located substantially parallel to the first conductive via. An embedded electro-optical passive element is also provided that extends perpendicular to and between the first conductive via and the second conductive via. The electro-optical passive element embedded is located within a selected layer at a first depth in the printed circuit board, wherein such first depth is selected to reflect an incident electromagnetic wave back into the printed circuit board to enhance or diminish an electrical signal in the first conductive via by creating a positive or negative electromagnetic interference.

DETAILED DESCRIPTION OF THE INVENTION

In the following detailed description, numerous specific details are set forth in order to provide a thorough understanding of the embodiments. However, it will be understood by one of ordinary skill in the art that the embodiments may be practiced without these specific details. For example, well-known operations, structures and techniques may not be shown in detail in order not to obscure the embodiments.

Overview

According to one aspect, an electro-optical passive (EOP) element is introduced as a component/device which works simultaneously in the electrical and optical domains. The electro-optical passive (EOP) element may operate in the electrical domain as an electrical element to re-direct a signal current flowing in a signal via to a reference/ground via and prevent a further excitement of an electromagnetic wave beneath a signal layer. The EOP element may also operate in the optical domain as a mirror to reflect the incident electromagnetic waves in a predefined manner to provide positive or negative interference for the total electromagnetic field in specified point of VIA channel where signal trace is connected.

According to one feature the location of the EOP element along a via pair is specifically selected to achieve a desired positive (constructive) or negative (destructive) interference. That is, the location of the EOP element along the via channel is not random or arbitrarily located along the thickness of the PCB. Rather, the location or distance (e.g., specific signal layer) for the EOP element may be selected, for example, to provide a desired value and/or direction of a geometrical sum of electromagnetic vectors (e.g., incident electromagnetic wave and reflected electromagnetic wave) to achieve a particular positive or negative electromagnetic interference.

Via Channel Current Flow without an Electro-Optical Passive Element

Figure 5:
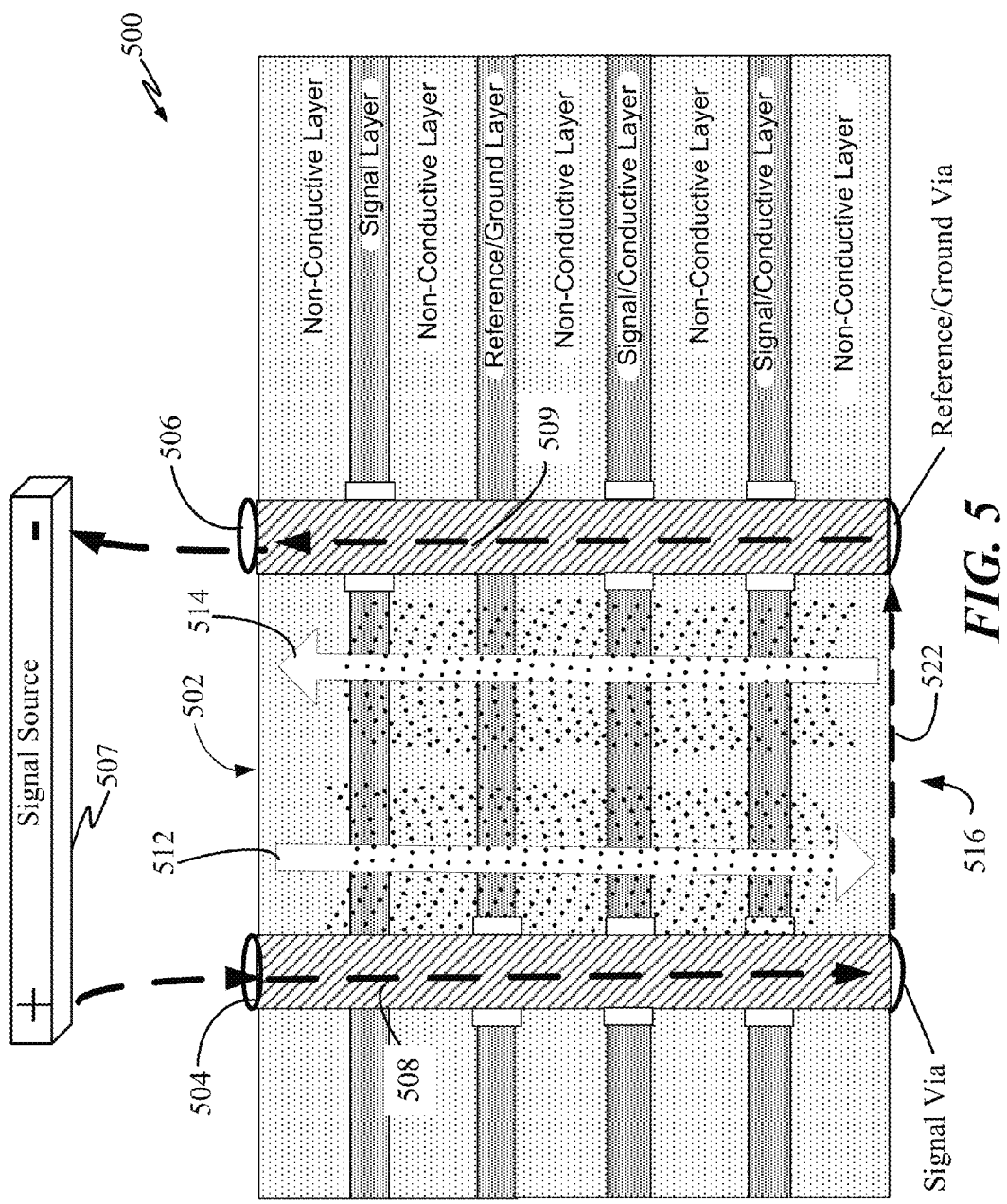
FIG. 5 illustrates a current flow in a via channel when an EOP element or component is not used in a PCB.

FIG. 5 illustrates a current flow in a via channel 502 when an EOP element or component is not used in a PCB 500. The PCB 500 may include a plurality of non-conductive layers with conductive layers (e.g., signal layers, reference layers) in between. The electrical current 508 may flow from a signal source 507 through a signal via 504, the open-ended stub of the signal via 504 and continues its way through the via channel dielectric 516 as a displacement current 522 and then returns to the signal source 507 through a reference/ground via 506 as a reference/ground current 509. As can be appreciated here, an incident electromagnetic wave 512 is induced by the signal current 508. The incident electromagnetic wave 512 may propagate beyond the end of the PCB 500 and/or may cause a reflected electromagnetic wave 514. The incident electromagnetic wave 512 and/or the reflected electromagnetic wave 514 may cause unwanted interference which may result in signal loss and/or frequency notches.

Via Channel Current Flow with an Electro-Optical Passive Element

Figure 6:
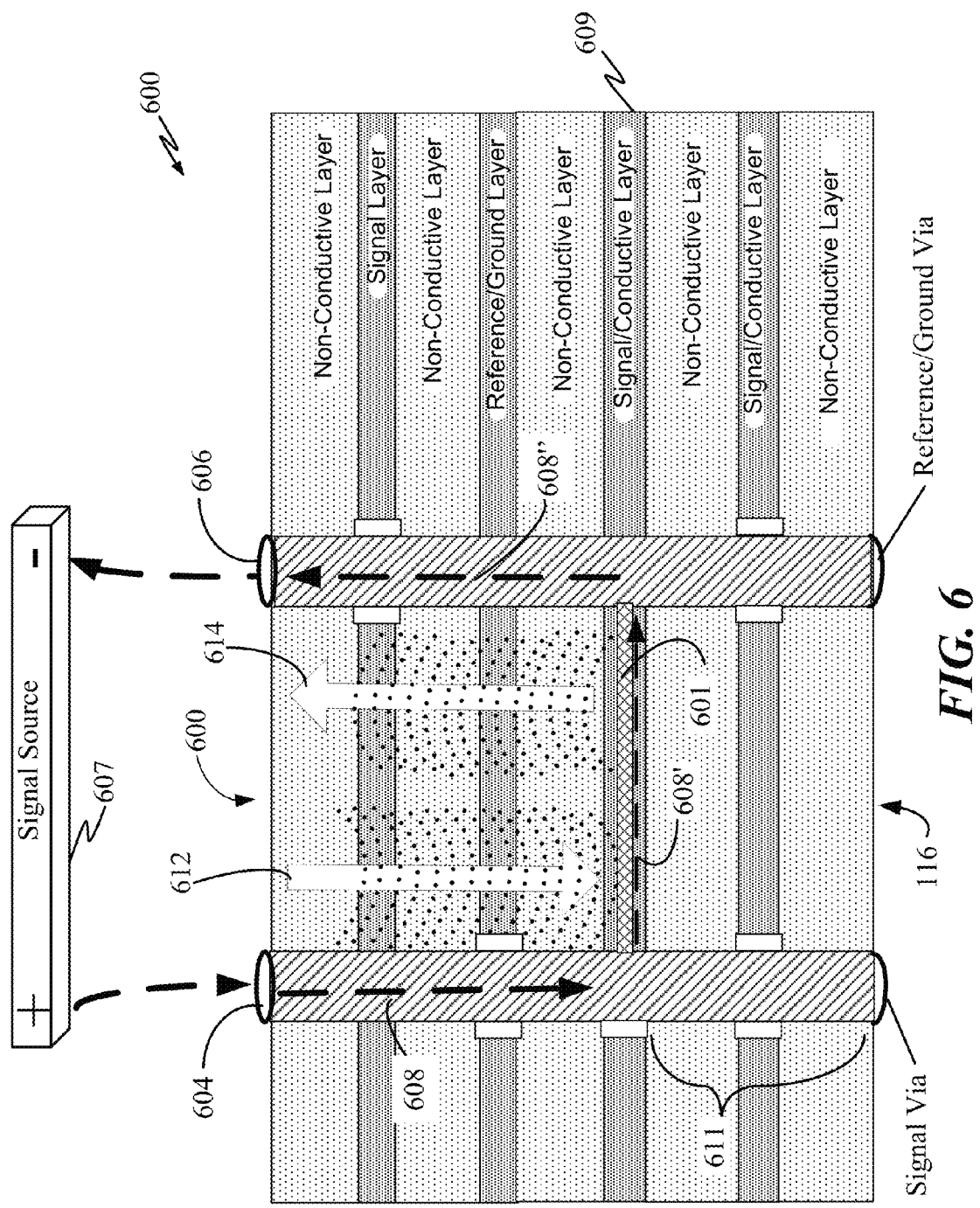
FIG. 6 illustrates the flow of current through a via channel 600, having an open-ended stub, but with an EOP element 601 coupled along a selected position between a via pair.

FIG. 6 illustrates the flow of current through a via channel 600, having an open-ended stub, but with an EOP element 601 coupled along a selected position between a via pair. The PCB 600 may include a plurality of non-conductive layers with conductive layers (e.g., signal layers, reference layers) in between. The via channel 600 comprises a dielectric medium bounded by current carrying rails (e.g., a signal via 604 and one or more reference/return vias 606). The signal via 604 may traverse through a plurality of conductive and/or non-conductive layers of the PCB 600. In a first implementation, the signal via 604 and/or reference/return via 606 may extend through the PCB layers (e.g., from a first surface of the PCB 600 to an opposite second surface). In a second implementation, the signal via 604 and/or reference/return via 606 may be blind vias where the hole extends only partially through the PCB (e.g., across a subset of the layers for the PCB 600). In a third implementation, the signal via 604 and/or reference/return via 606 may be through-hold vias (e.g., extending across the PCB layers) but has been back drilled so that the conductive material of the via only extends through a subset of the layers for the PCB 600). Note that in some implementation, both the signal via 604 and/or reference/return via 606 may be of the same via type (e.g., a through-hole via, a blind via, or a back drilled via, etc.) or they may be of different via types (e.g., combinations of a through-hole via, a blind via, and a back drilled via, etc.).

A signal source 607 may insert or provide a signal (e.g., a high frequency signal (e.g., 5 GHz or higher) to the signal via 604. The electrical signal current 608 flows from the signal source 607 through the signal via 604. From the signal via 604, the signal current 608 then flows through a conductive body of an EOP element 601 and returns to the signal source 607 through its associated reference/ground via 606. In one embodiment, the EOP element 601 may be partially realized as an element (e.g., low impedance resistor) that changes the direction of an electrical current with only a small energy loss to the signal. For instance, the EOP element 601 causes the electrical current 508 to be diverted through the EOP element 601 from a signal via 604 to the reference/return via 606. As illustrated here, the signal current 608, 608', and 608" flows from the signal via 604, across the EOP element 601, and to the reference/return via 606. The EOP element 601 thus prevents such signal current 608 from flowing into the via portions in layers below the EOP element 601.

The signal current 608 through the signal via 604 induces an incident electromagnetic wave 612 while the signal current 608" through the reference/return/ground via 606 induces a reflected electromagnetic wave 614. The electromagnetic waves 612 and/or 614" may be substantially excluded or cancelled by absorption or dissipation as well as by controlling the reflected electromagnetic wave 614 so that it interferes (e.g., cancels) the incident electromagnetic wave 612. The electromagnetic waves 612 and 614 are excited by the source current 608 in the via barrels and propagates in the dielectric medium between the via barrels 604 and 606 and is reflected with the use of the electro-optical passive (EOP) element 601.

According to one feature, reflection of the electromagnetic wave is specifically engineered to reduce signal loss and/or minimize or avoid attenuation notches within a frequency band. The EPO element 601 may be designed to provide an electrical solution by changing the direction of electrical current in the current rails/via barrels 604 and 606 with the smallest signal losses to prevent exciting/inducing an electromagnetic wave in the lower via portion 611 as well as preventing the propagation of the incident electromagnetic wave 612 into the lower via portion 611. In this manner, the EOP element 601 inhibits a new portion of the electromagnetic wave in the dielectric material in the layers below the signal layer 609.

The EPO element 601 is also arranged to provide an optical solution by selecting a location or position along the length of the via pairs 604 and 606 such that the EOP element 601 reflects the existing electromagnetic wave in the via channel so as to achieve positive (constructive) interference or negative (destructive) interference between the forward travelling (incident) electromagnetic wave 604 with backward travelling (reflected) electromagnetic wave 614. In one example, constructive interference is used to increase a total signal strength and compensate for dielectric and copper losses at higher frequencies and/or suppress undesirable frequency notches. In another example, destructive interference is used, for instance, to attenuate glitches or spikes at particular frequency bands in the frequency response for the transmission link and/or via channel.

Due to these electrical and optical characteristics, the EOP element 601 operates simultaneously and/or concurrently in the electrical domain and optical domain to increase transmission bandwidth, control the characteristic impedance of the current path (not just the via section) without the need for back drilling. In some implementations, the EOP element 601 may be implemented on electrical paths for high frequency signals in a PCBs (e.g., 5 GHz and higher). By characterizing a signal in both the electrical domain and optical domain it has been observed that around 5-7 GHz, the signal behavior along the transmission path from (a) an electrical signal response loss to (b) an electrical and electromagnetic signal loss response. Above this 5-7 GHz boundary, the electromagnetic behavior (e.g., same as optical behavior) begins to be more and more pronounced as frequency increases.

Figures 7A, 7B:
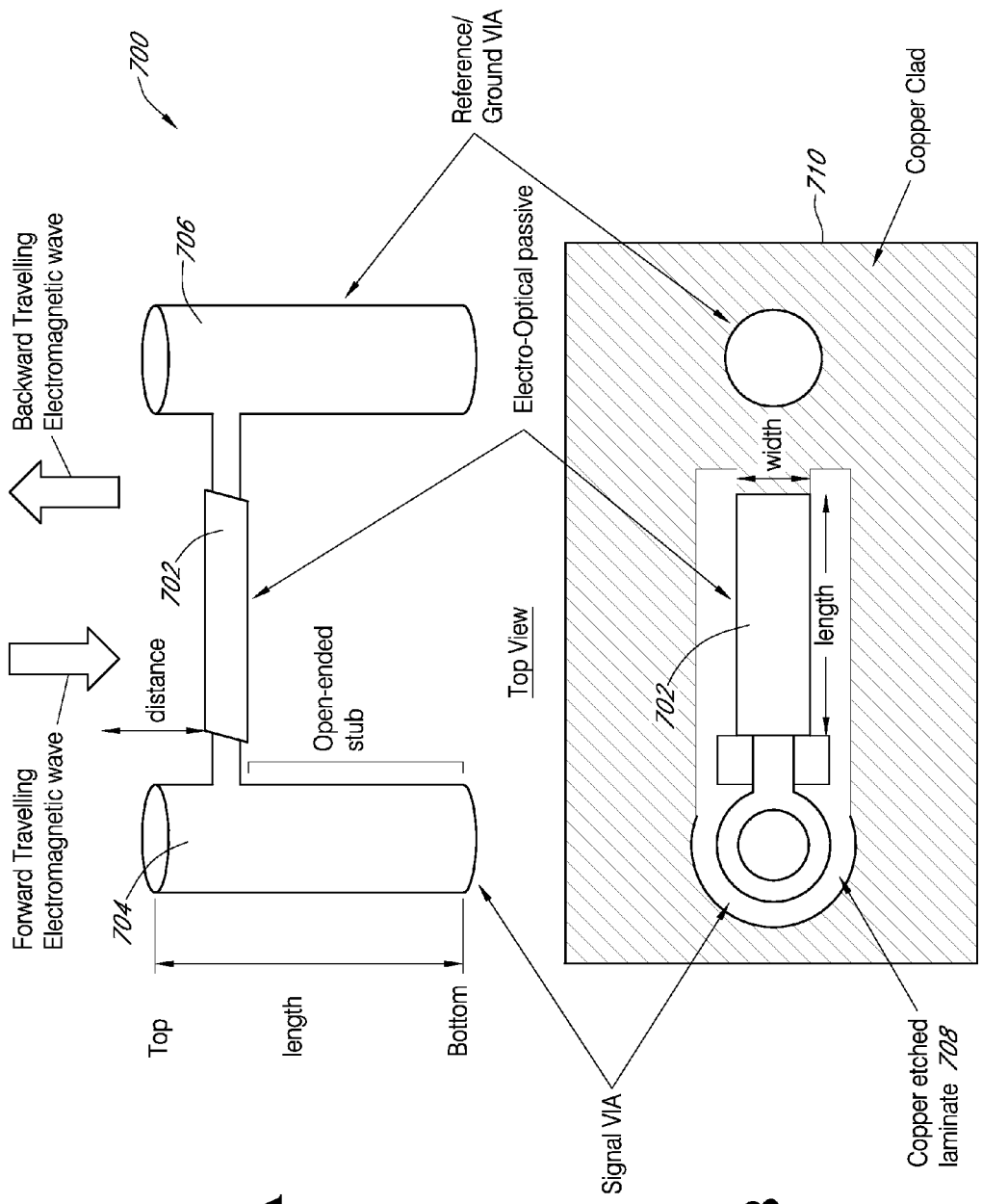
FIG. 7A illustrates a side view of an electro-optical passive (EOP) structure according to one embodiment.
FIG. 7B illustrates a top view of the electro-optical passive structure of FIG. 7A.

FIG. 7A illustrates a side view of an electro-optical passive (EOP) structure according to one embodiment. FIG. 7B illustrates a top view of the electro-optical passive structure of FIG. 7A. The electro-optical passive structure 700 may comprise an EOP element 702 extending between a pair of current carrying rails (via barrels). The current rails may include a signal via 704 and a reference/return via 706. In one embodiment, the EOP element 702 may be realized with any known material that meets the desired requirements to minimize signal loss and can be implemented within the structure without affecting the overall thickness of a printed circuit board. A conductor etched laminate 708 may surround the EOP element 702 and a conductive layer 710 may surround the conductor etched laminate 708. The conductive layer 710 may be part of a conductive layer within a PCB in which the electro-optical passive structure 700 is embedded.

FIGS. 7A and 7B illustrate a simplified EOP structure including one signal via and one reference/return via. However, it should be understood that other embodiments may comprise a plurality of signal vias and a plurality of reference/return vias.

The shape (e.g., size or area) of the EOP element 702 and distance or location of the EOP element relative to the signal source is specifically selected to minimize signal loss and a desired frequency response. In this example, the length and/or width of the EOP element 702 may be specifically selected to reflect the incident electromagnetic wave while also minimizing signal loss. The shape and/or location of the EOP element may be dependent on the operating frequency band, connector pin-field characteristics, via characteristics (e.g., via diameter, via length, separation between vias, etc.) PCB characteristics (e.g., laminate coefficients, layer thickness, PCB design, etc.). In one approach, the EOP shape, distance, location or displacement may be ascertained by obtain a three dimensional model/simulation of a particular PCB electrical and/or electromagnetic response using, for example, Computer Simulation Technology (CTS) Microwave Studio® or other modeling/simulation software.

While some of the examples herein illustrate a single signal via and a single reference via, it should be understood that there may be a plurality of signal vias and a plurality of reference vias. The number and/or position of the reference vias relative to a signal via and the shape, size, position, and/or location of the EOP element between a via and one or more reference vias will depend on the electromagnetic propagation for the signal via. Such electromagnetic wave propagation may be simulated and/or modeled for each type or arrangement of signal vias and may be dependent on many factors, including via diameter, PCB conductive layer and non-conductive layer characteristics, signal frequency, etc. That is, the electromagnetic wave propagation for a particular signal via may dictate how many reference vias will be used, the position of the vias, and the location, size, and/or position of the EOP element between the signal via and the one or more reference vias.

Figure 7C:
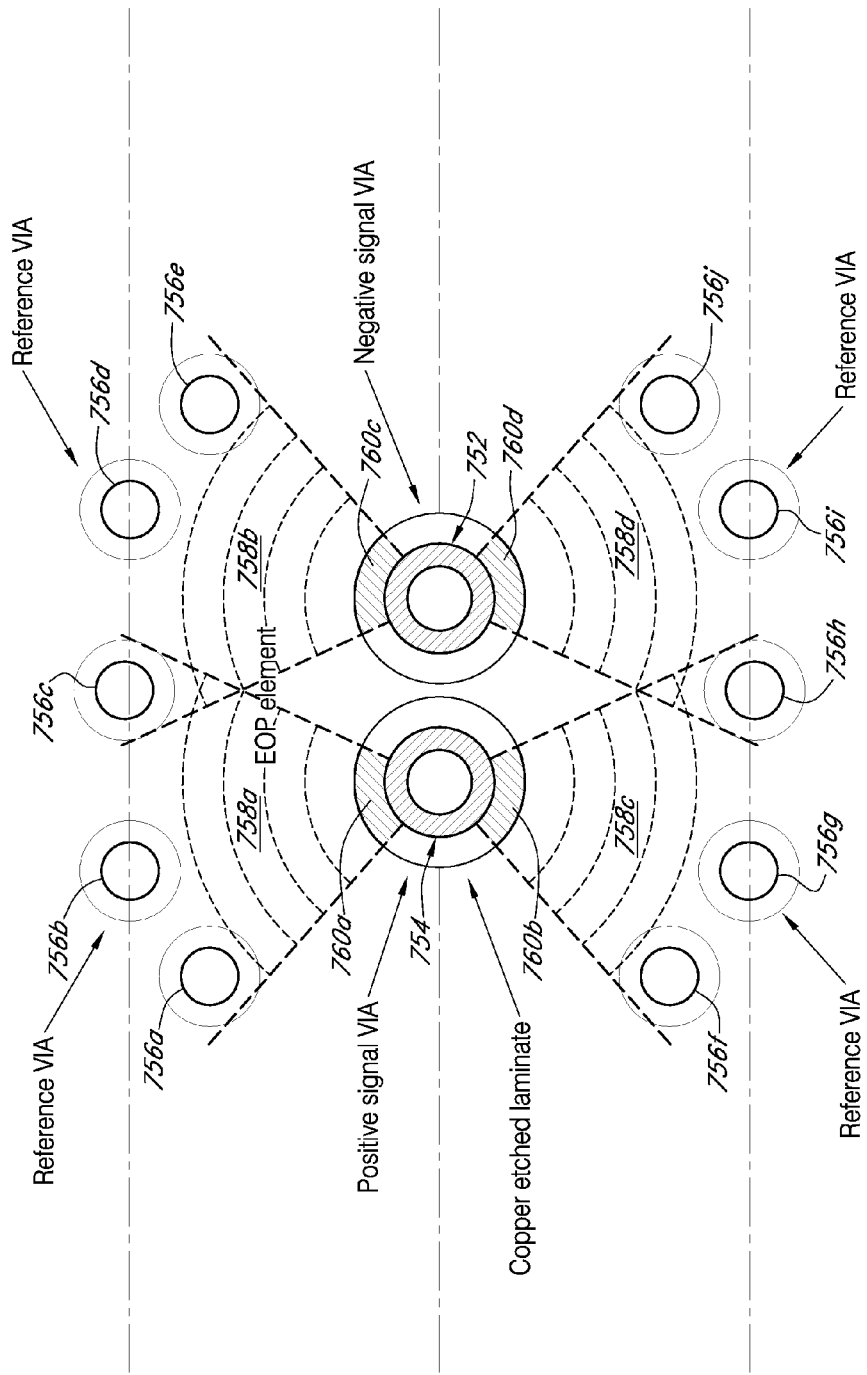
FIG. 7C illustrates one example of a differential signal via pair with a plurality of reference/ground vias arranged in regions where electromagnetic waves propagate.

FIG. 7C illustrates one example of a differential signal via pair 752 and 754 with a plurality of reference/ground vias 756a-j arranged in regions 758a-d where electromagnetic waves propagate. Once the regions 758a-d have been identified, the reference vias 756a-j may be positioned and/or arranged in these regions. The size and location of the EOP element(s) 760a-d is also dependent on the electromagnetic propagation characteristics of the differential via pairs 752 and 754. In this example, a positive signal via 754 has two EOP elements 760a and 760b positioned in the regions of electromagnetic propagation 758a and 758b. Note that the location of the reference vias 756a-j may actually be closer to the vias 752 and 754, but have been shown further apart for purposes of illustration.

Figure 1:
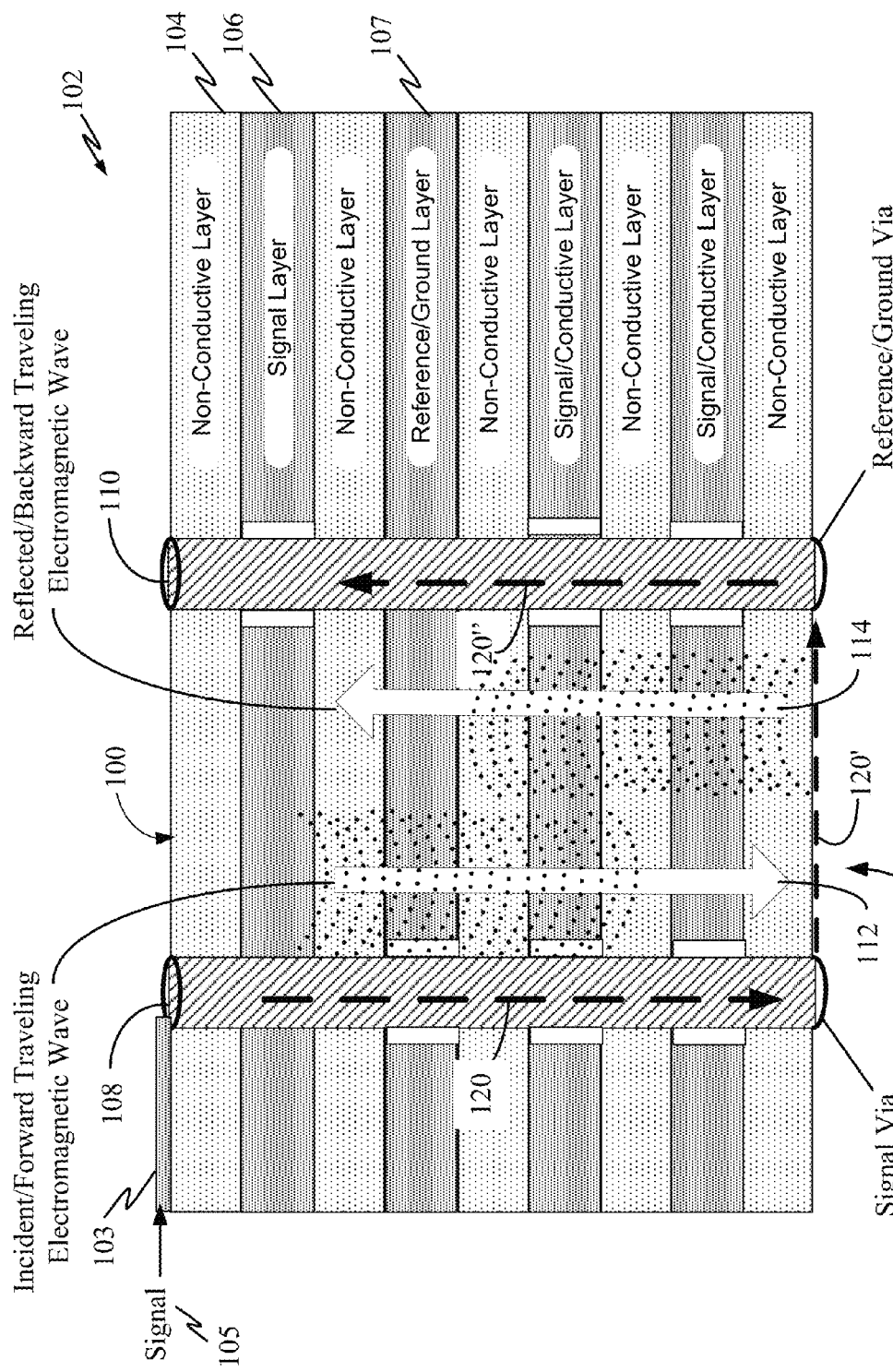
FIG. 1 illustrates a via channel having an open-ended stub located within a PCB.
Figure 2:
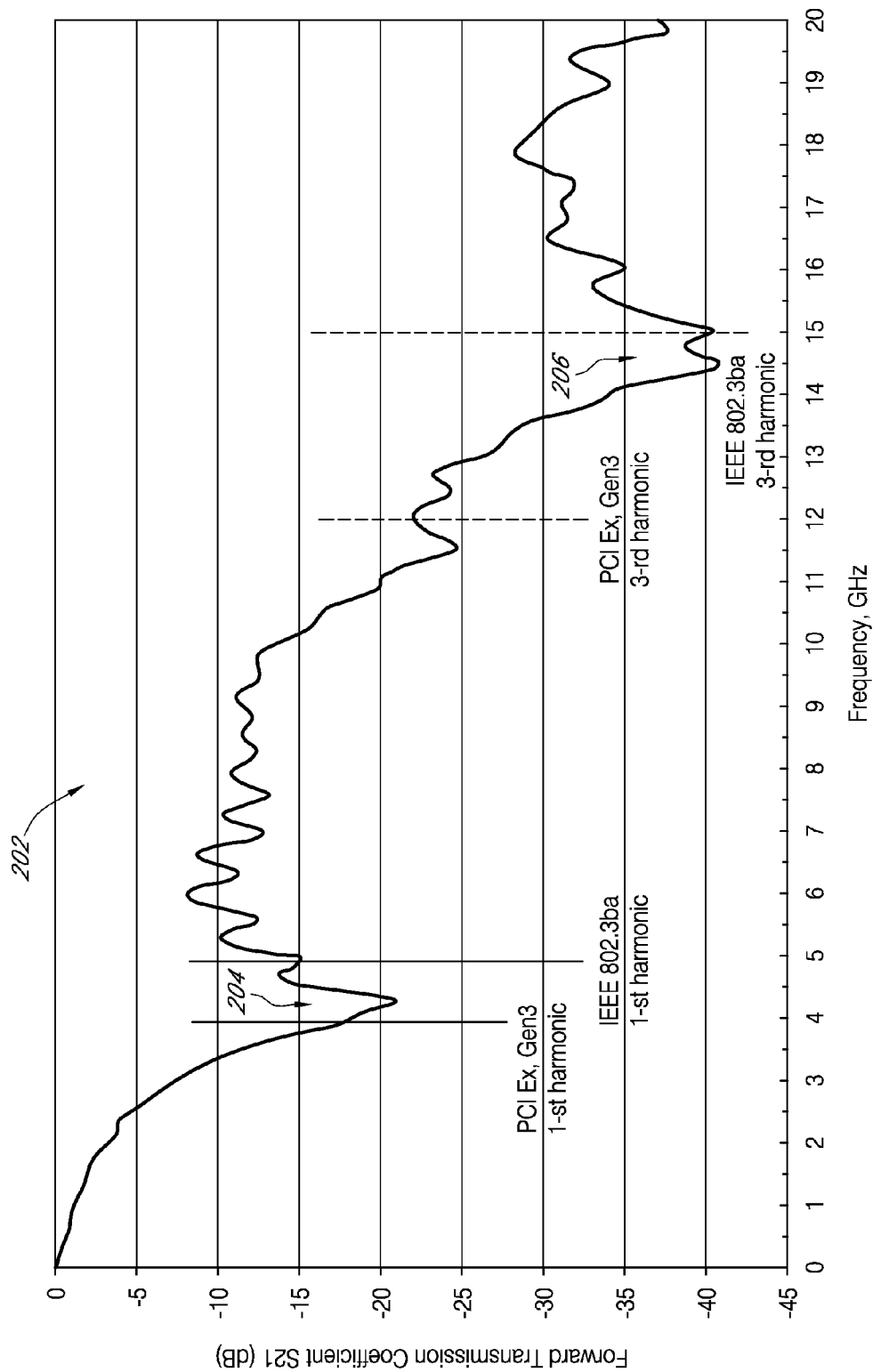
FIG. 2 illustrates a typical S21 attenuation pattern for a transmission line with an open ended plated through hole via.
Figure 3:
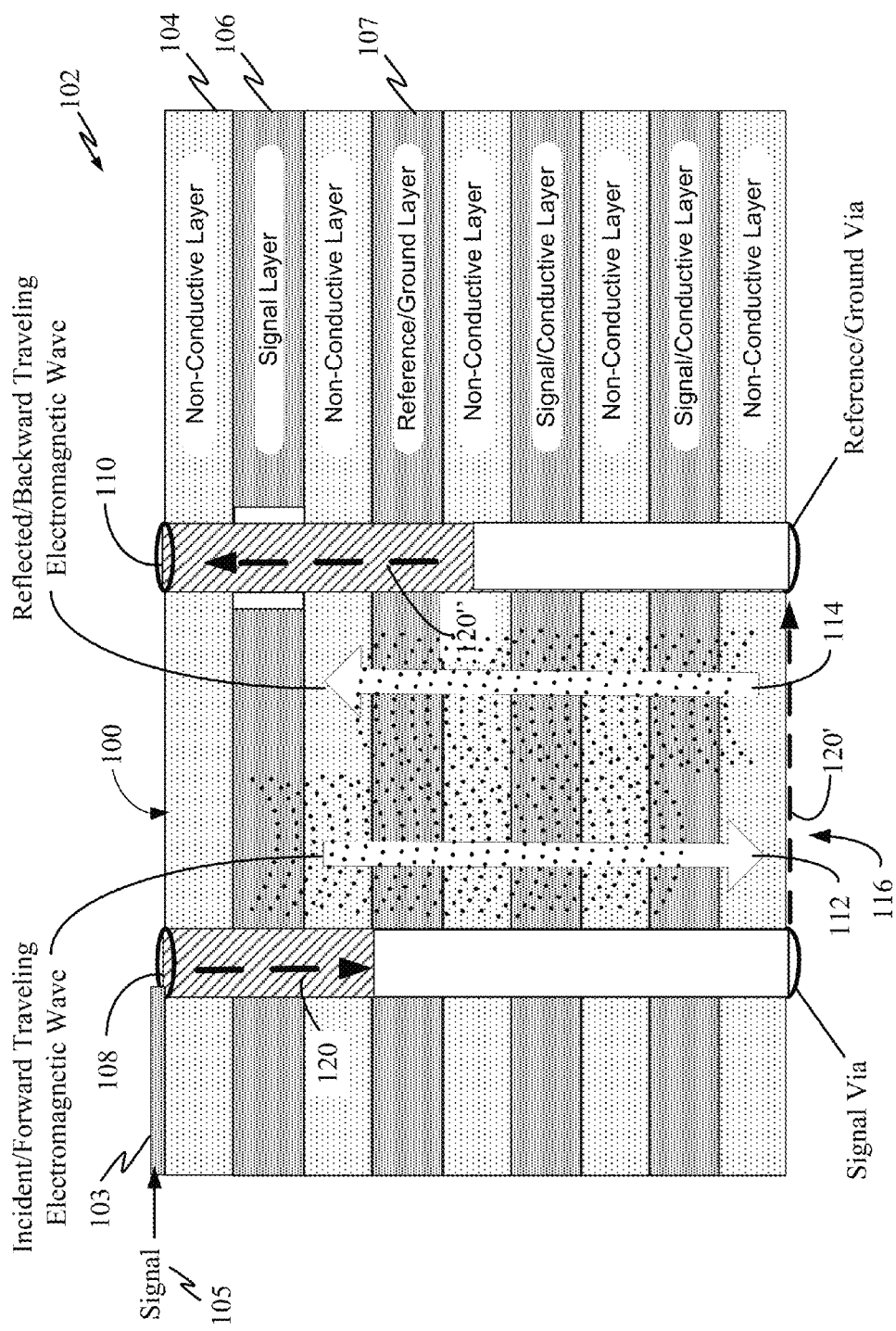
FIG. 3 illustrates the via channel of FIG. 1 where the vias have been back drilled within the PCB.
Figure 4:
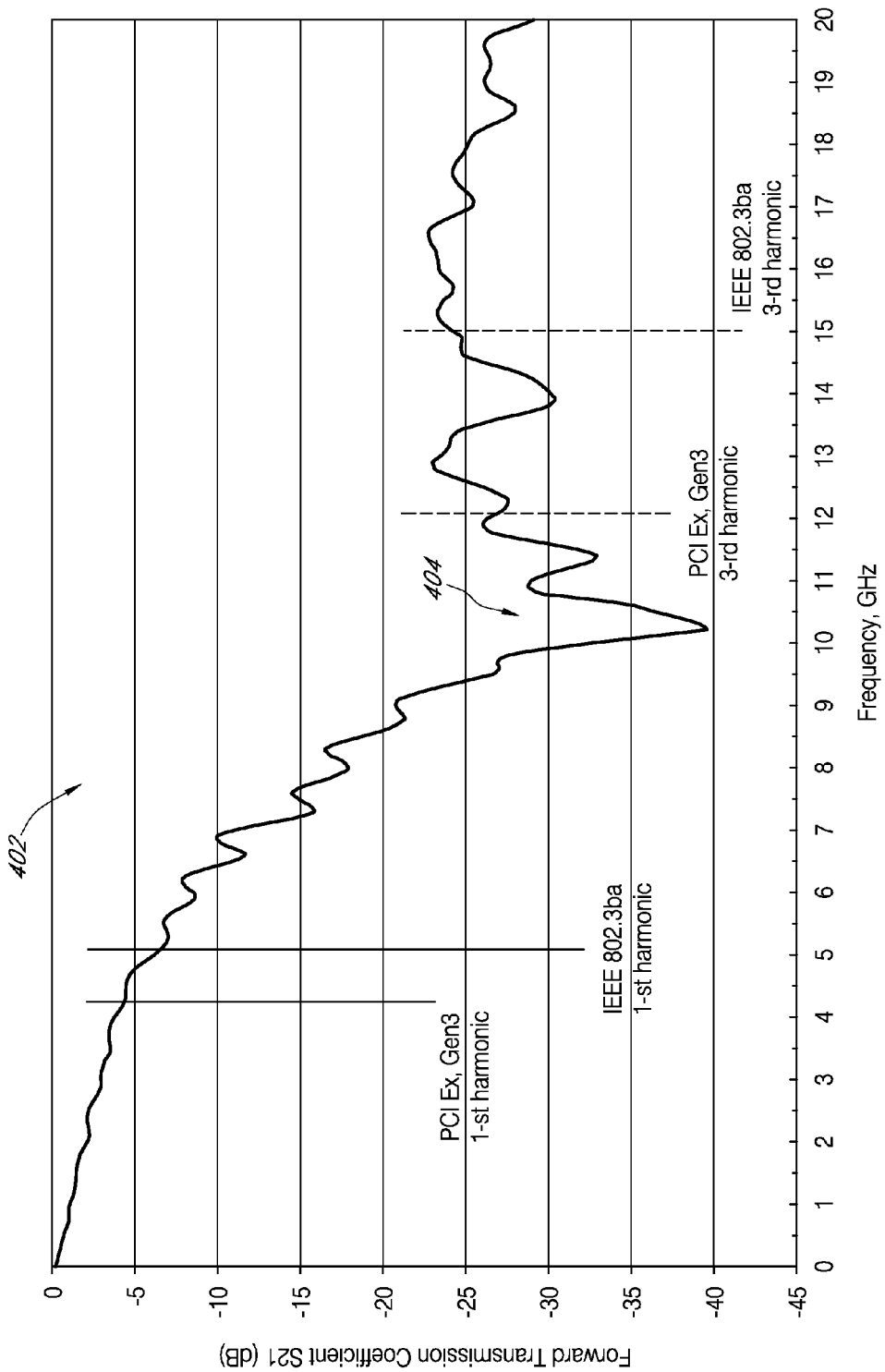
FIG. 4 illustrates a S21 attenuation pattern for a transmission line structure similar to FIG. 3 with the stubs of the paired via back drilled.
Figure 8:
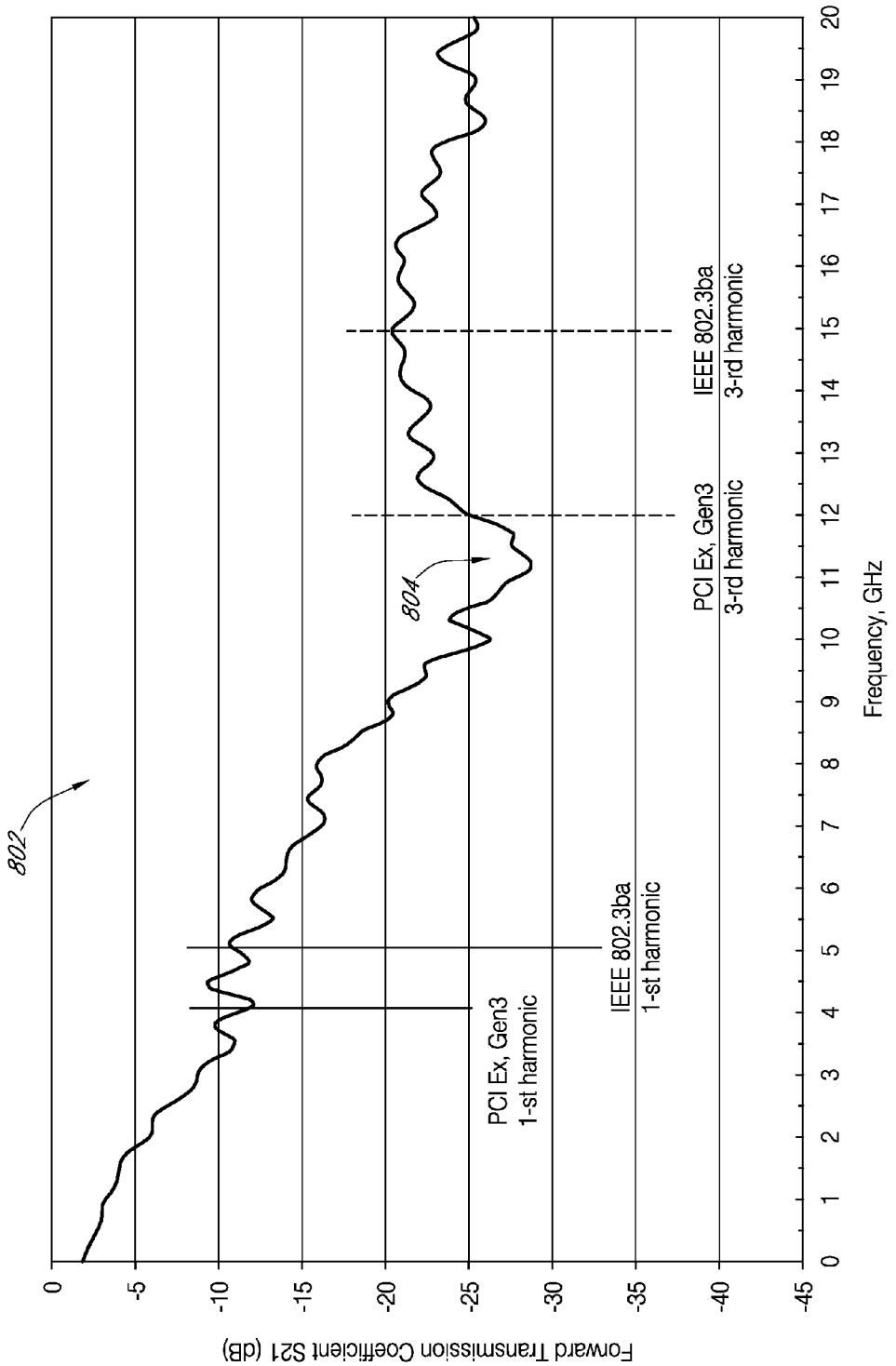
FIG. 8 illustrates a S21 attenuation pattern response for a transmission line with an electro-optical passive (EOP) element embedded in a via channel.

FIG. 8 illustrates a S21 attenuation pattern response 802 for a transmission line with an electro-optical passive (EOP) element embedded in a via channel. As shown, embedding an EOP element within the via channel removes the interference notches at the first harmonics and the interference and attenuation notches at the third harmonics. That is, the frequency notch 804 shows approximately a 27 dB loss or attenuation while the loss in FIGS. 2 and 4 for the third harmonics is closer to 40 dB. Moreover, the signal insertion loss may be significantly reduced by approximately 20 dB in the critical area of the third harmonics, as compared to the S21 response for an open ended plated through-hole via and back drilled via illustrated in FIGS. 2 and 4. In one example, the EOP element may operate as a mirror that reflects forward traveling electromagnetic waves in a positive manner to provide compensation for the dielectric and copper losses with a targeted multi-GHz frequency region or band.

Simulation Model without EOP Element

Figure 9:
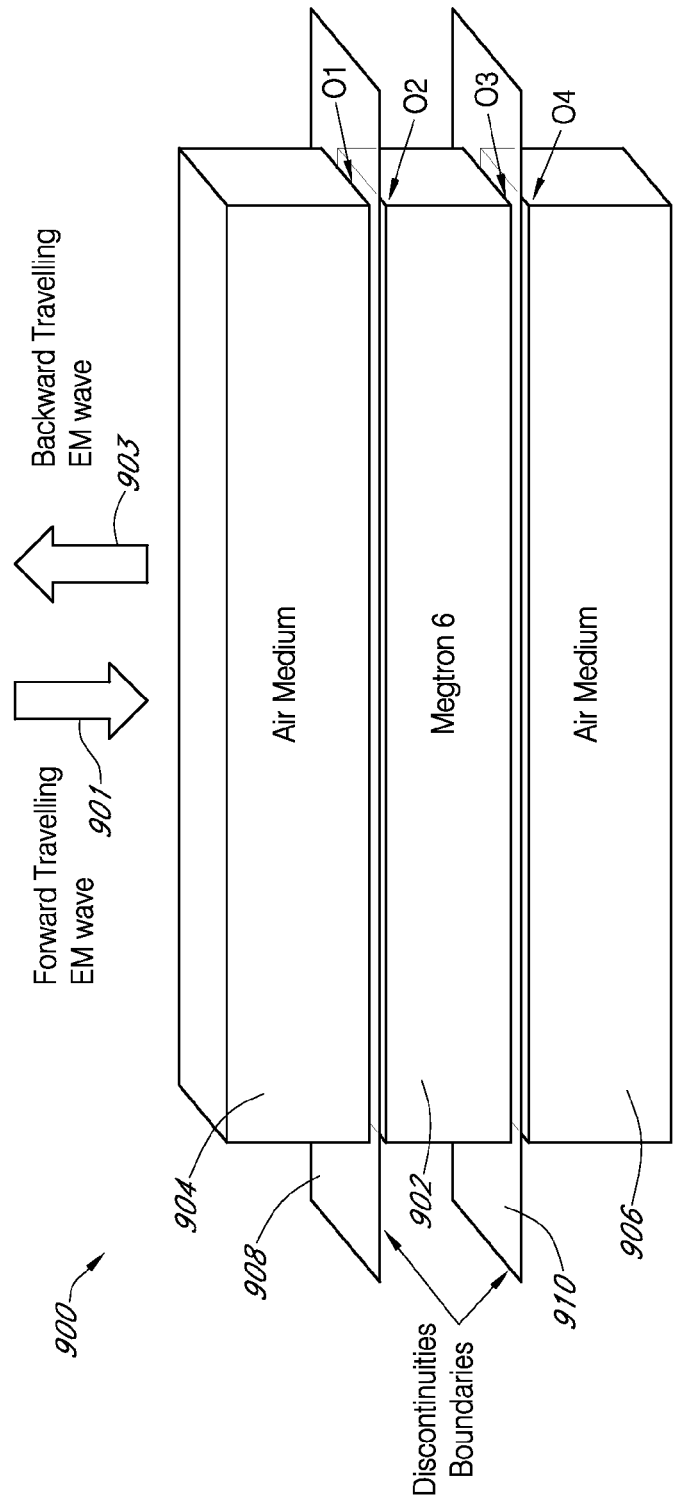
FIG. 9 illustrates a simulation for the propagation of an electromagnetic wave through an air-laminate-air medium.

FIG. 9 illustrates a simulation for the propagation of an electromagnetic wave through an air-laminate-air medium. To more fully understand the reflection and compensation phenomenon described herein, this simulation models the propagation of an electromagnetic wave 901 through an air-laminate-air medium 900 (e.g., air-Megtron 6-air medium) that matches the propagation of an electromagnetic wave in a via channel without the use of an EOP element. The electromagnetic simulation of this auxiliary structure illustrates an ideal case/upper evaluation for a real plated through hole and back drilled vias. In this example, the simulation 900 includes a Megtron 6 laminate 902 between a pair of air mediums 904 and 906. First and second planes 908 and 910 illustrate infinitesimal electromagnetic boundaries located between different propagation mediums where boundaries O1 & O3 indicate a top side of an electromagnetic boundary and O2 & O4 indicate a bottom side of the same electromagnetic boundary. For example, boundary O1 indicates the top side of an electromagnetic boundary with the first air medium 908.

Figure 10:
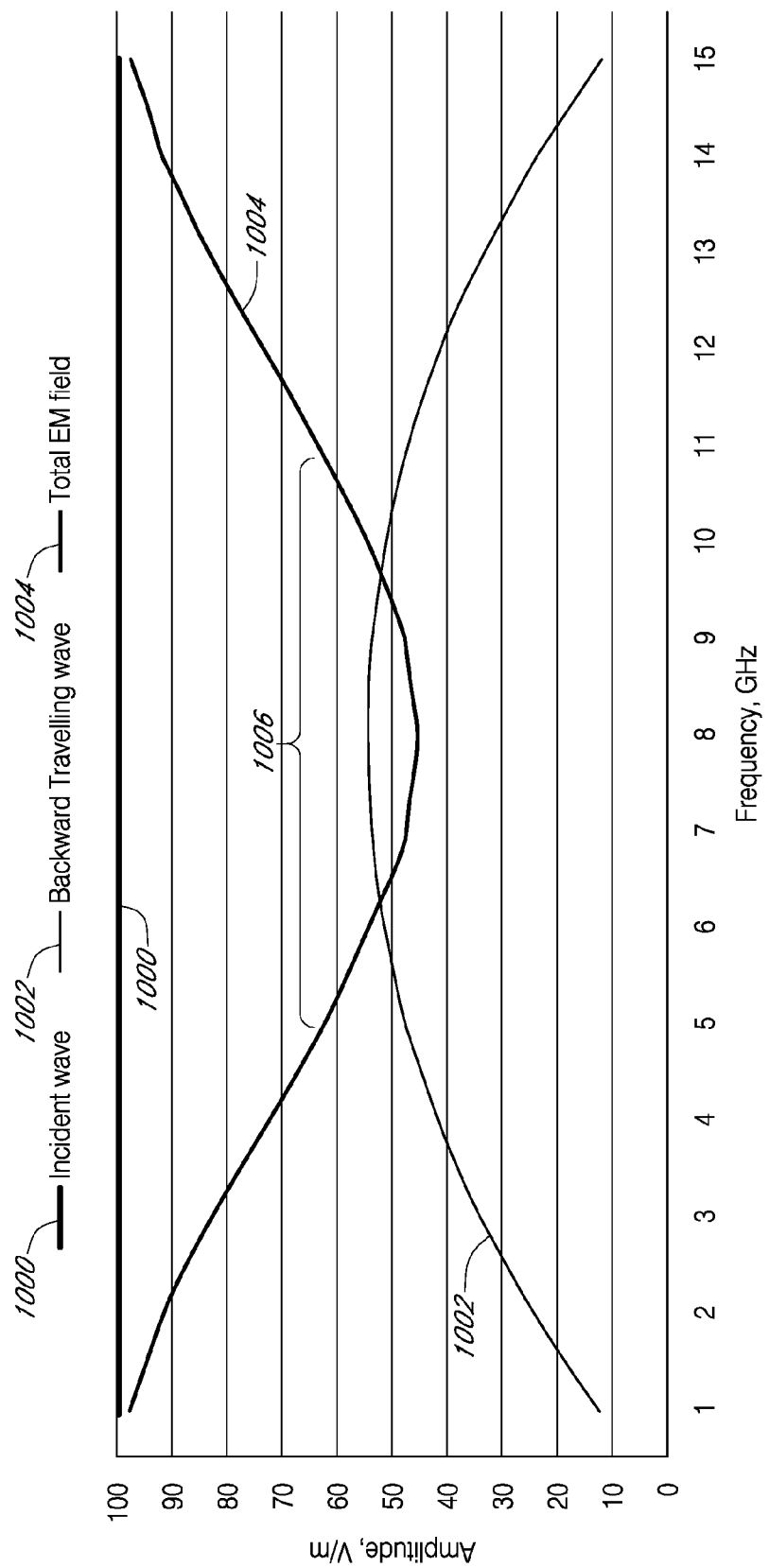
FIG. 10 illustrates simulation results of the via channel without the EOP element as shown in FIG. 9.

FIG. 10 illustrates simulation results of the via channel without the EOP element as shown in FIG. 9. The simulation illustrates the amplitude of incident, backward travelling waves and total electromagnetic field versus frequency at boundary O1 surface in FIG. 9. As shown, a large and strong notch 1006 is present in the center of the total EM field plot 1004. The notch 1006 is a result of up to a 50% reflection at the top of the Megtron 6 surface which changes up to 5 times in magnitude versus frequency.

Simulation Model with EOP Element

Figure 11:
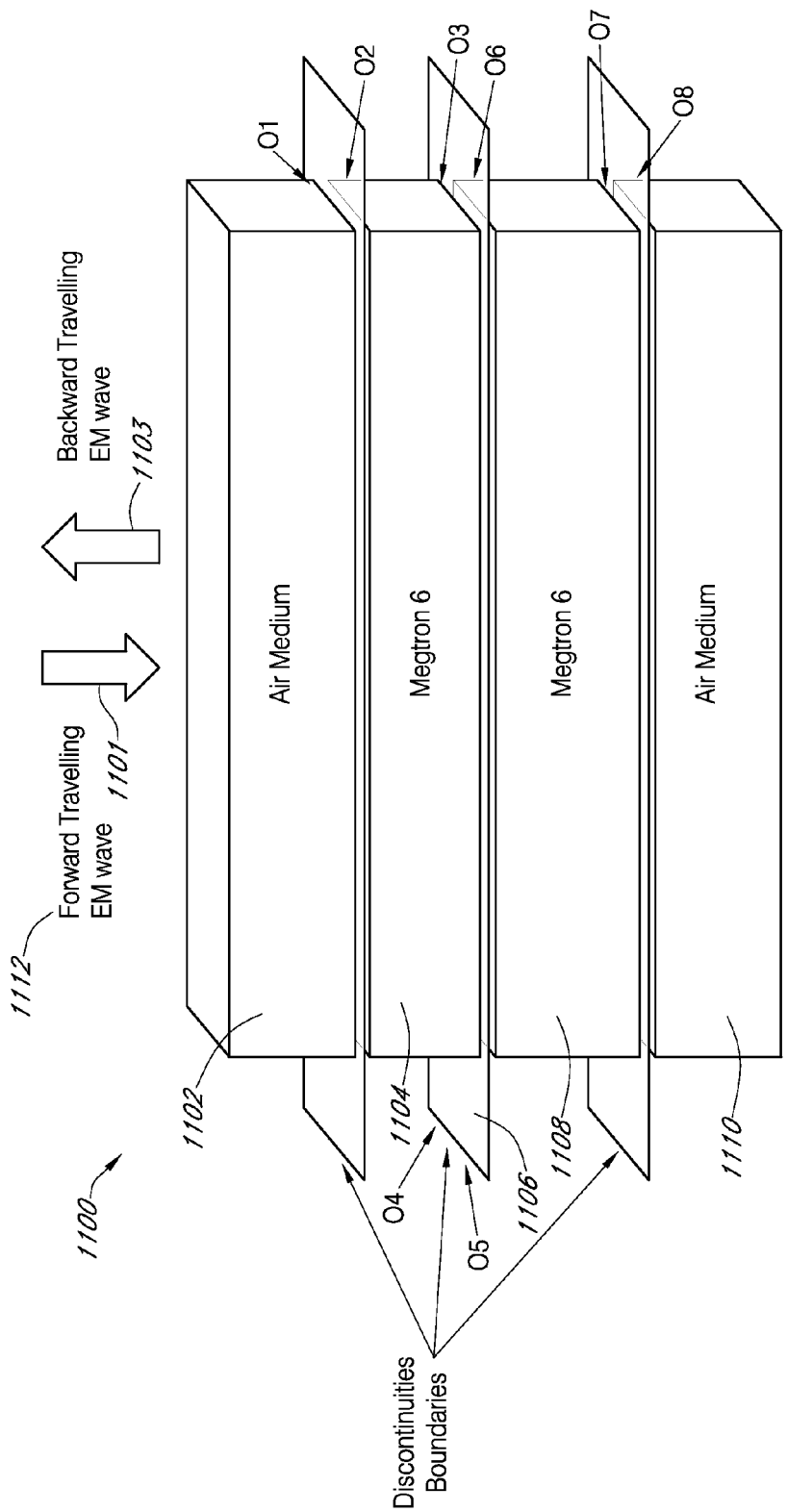
FIG. 11 illustrates a simulation for the propagation of an electromagnetic wave through an air-laminate-air medium having a built-in/embedded EOP element.

FIG. 11 illustrates a simulation for the propagation of an electromagnetic wave through an air-laminate-air medium having a built-in/embedded EOP element. The simulation model includes Air-Megtron 6-NiCr-Megtron 6-Air medium that matches propagation of an electromagnetic wave 1101 in the via channel with an EOP element implemented as shown, for example, in FIG. 6. More specifically, the simulation model 1100 comprises a first air medium 1102, a first Megtron 6 laminate 1104 on bottom of the first air medium 1102, an EOP element 1006 at bottom of the first Megtron 6 laminate 1104, a second Megtron 6 slab 1108 on bottom of the EOP element 1006 and a second air medium 1110 on bottom of the second Megtron 6 laminate 1108. In one embodiment, the EOP element 1106 may be a layer of, for example, Nickel Chromium (NiCr). However, the EOP element 1106 may be realized with any known material that meets the desired electrical characteristics, e.g., low impedance to minimize signal loss. For example, impedances in 0.05 ohms to 1 ohm may be used in a first instance, impedances, of 1 ohm to 5 ohms may be used in other instance, and impedances of 5 ohm to 100 ohms may be used in other cases.

As shown in FIG. 11, boundary O2 indicates the bottom side of the electromagnetic boundary between the first air medium 1002 and the first Megtron 6 slab 1104 and pertains to the Megtron 6 medium. Boundary O3 indicates the top side of the electromagnetic boundary between the first Megtron 6 laminate 1104 and the EOP element 1106 (NiCr layer/laminate) and pertains to the Megtron 6 medium.

Boundary O4 indicates the bottom side of the electromagnetic boundary between the first Megtron 6 laminate 1104 and the EOP element 1106 (NiCr laminate) and pertains to the NiCr medium. Boundary O5 indicates the top side of the electromagnetic boundary between the EOP (NiCr laminate) 1006 and the second Megtron 6 laminate 1008 and pertains to the NiCr medium.

Boundaries O1-O8 in FIG. 11 indicate the planes for which the electromagnetic fields are calculated. Simulation data shows the intensity of the electrical field as a function of frequency. Note that a receiver will see only a total electromagnetic field which is a sum of a forward/incident electromagnetic wave 1101 and a backward/reflected electromagnetic wave 1103.

Figure 12:
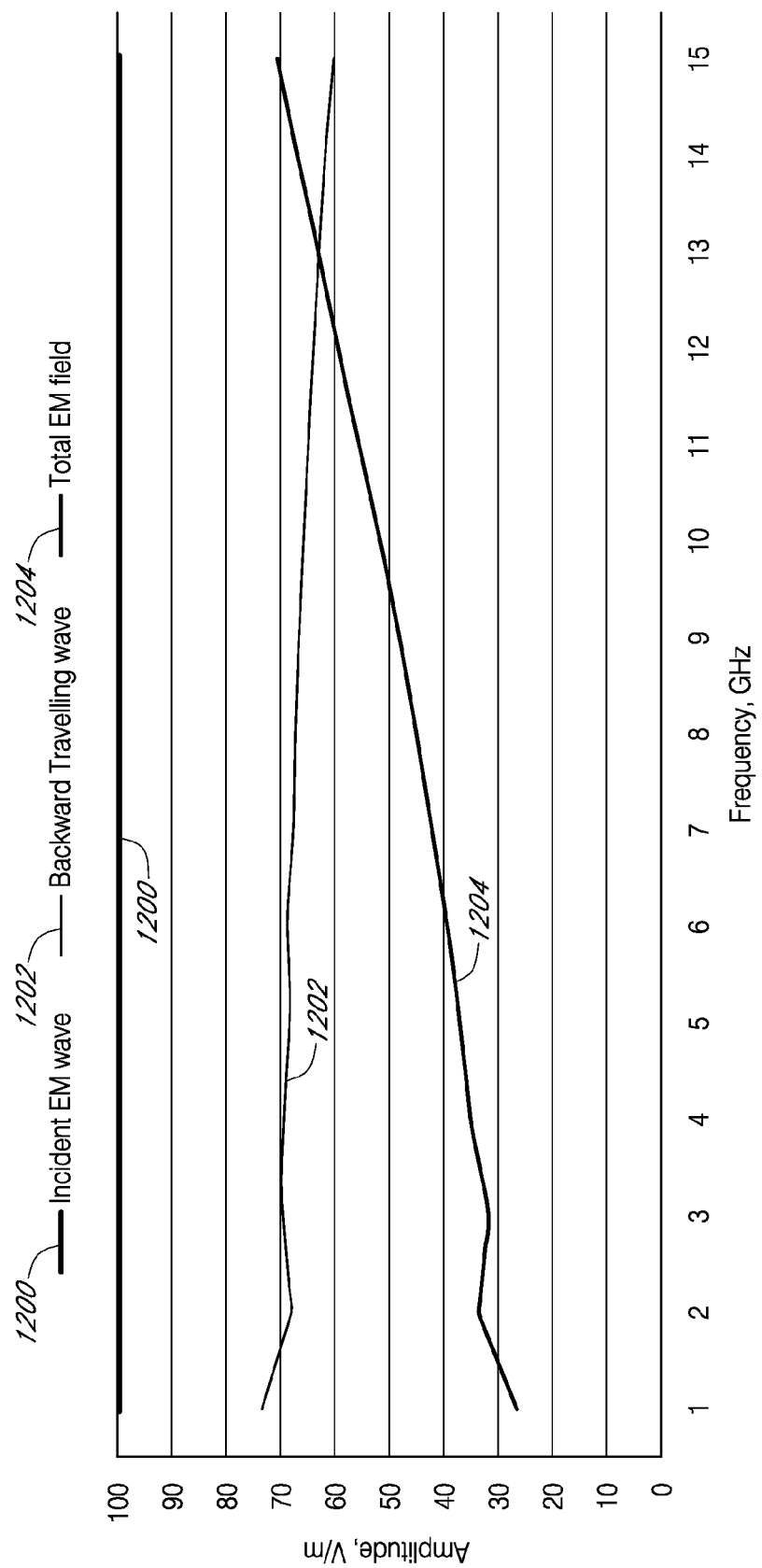
FIG. 12 illustrates a simulation of the via channel with the EOP element.

FIG. 12 illustrates a simulation of the via channel with the EOP element. The simulation illustrates the amplitude of incident, backward travelling waves and total electromagnetic field vs. frequency at the O1 boundary surface in FIG. 11. As shown, the presence of the EOP element (NiCr layer) causes large, up to 70% reflection (backward traveling wave 1202), with a small slope of reflection amplitude versus frequency as well as an increase of the total electromagnetic field 1204 versus frequency. As such, the EOP element acts as a mirror to increase the total electromagnetic field as a result of positive interference of a forward travelling wave 1200 and reflected/backward travelling wave 1202. Also, at the same time, this phenomenon explains a growth up to 20 dB of S21 response in critical area of the 3rd harmonics that was shown in FIG. 8.

Figure 13:
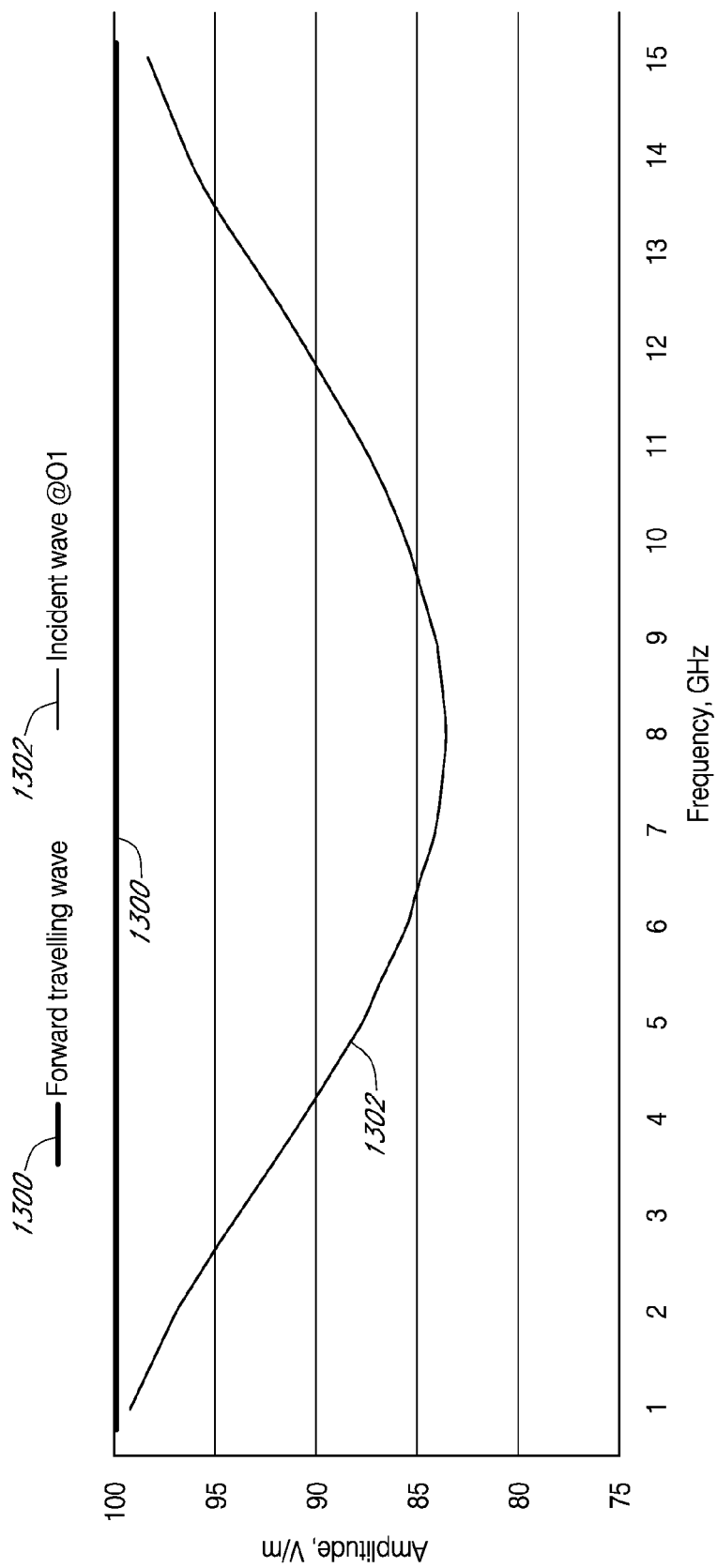
FIG. 13 illustrates a graph showing that electromagnetic field propagates through structure without EOP element as a transparent media with up to 15% attenuation only for the boundaries in FIG. 9.
Figure 14:
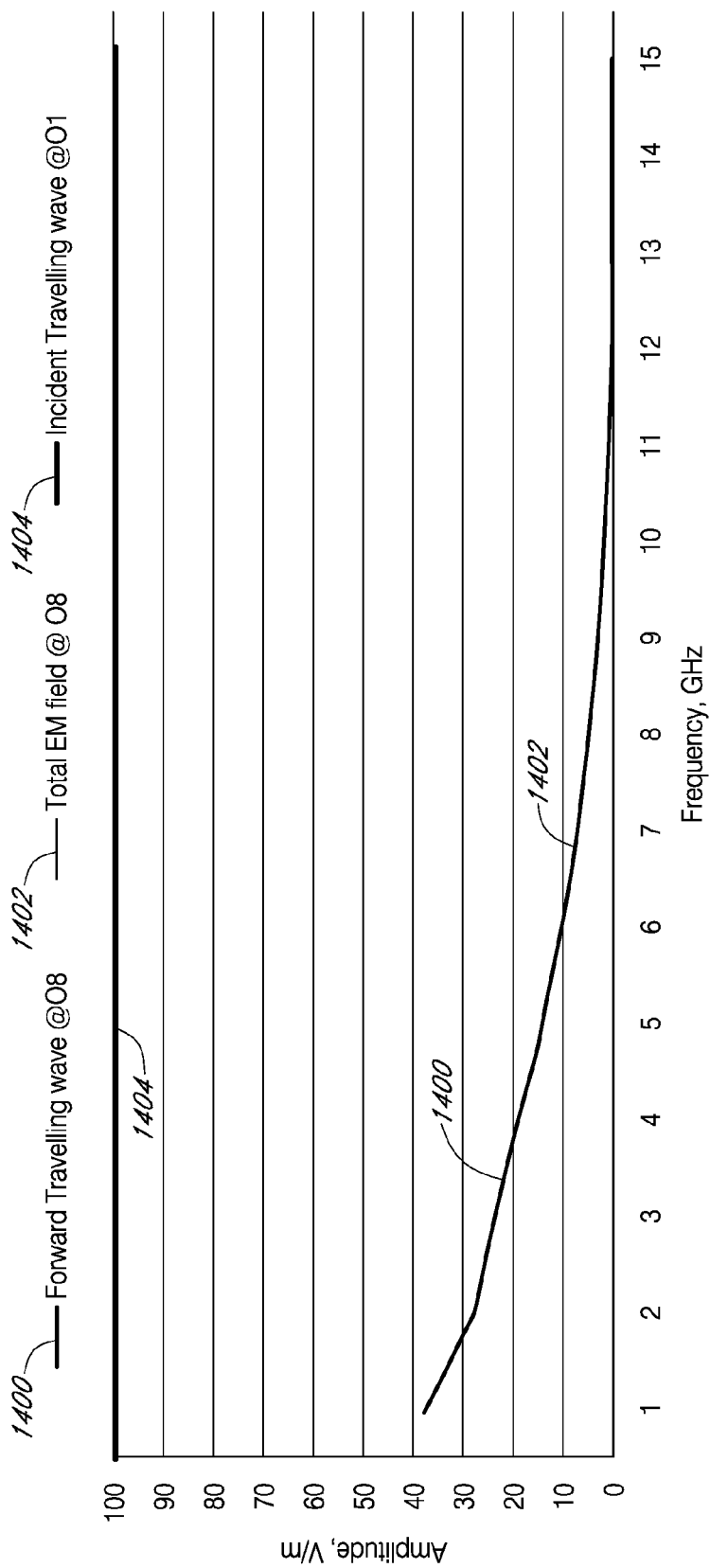
FIG. 14 illustrates a graph that shows that for a structure having the embedded EOP element the electromagnetic field starts with only 40% of the incident field at 1 GHz and drastically drops to 0.05% at 15 GHz for the boundaries in FIG. 11.

FIG. 13 illustrates a graph showing that electromagnetic field propagates through structure without EOP element as a transparent media with up to 15% attenuation only for the boundaries in FIG. 9. FIG. 14 illustrates a graph that shows that for a structure having the embedded EOP element the electromagnetic field starts with only 40% of the incident field at 1 GHz and drastically drops to 0.05% at 15 GHz for the boundaries in FIG. 11. This shows that with higher frequencies the optical properties of the EOP element may be more dominant than the electrical effects and can provide significant improvement for higher bandwidth transmission in PCBs. Because of Air-Megtron 6-Air structure shown in FIG. 9 matches plated through hole via or a back drilled via, FIG. 13 shows also that both type of vias will strongly radiate and could induce noise in adjacent PCBs and stray currents in metal parts of a chassis which could bring problems to yield Electromagnetic Compliance (EMC) requirements.

The other side of the Air-Megtron 6-NiCr-Megtron 6-Air structure shown in FIG. 11 matches a via having an embedded EOP element. FIG. 14 illustrates a graph showing that output (i.e. radiation), drastically drops from 40% of the incident field at 1 GHz to 0.05% at 15 GHz due the reflection from EOP acting as a mirror. As such, the EOP element protects adjacent PCBs from noise and metal parts of chassis from stray currents and provides better conditions to meet EMC specifications.

Figure 15:
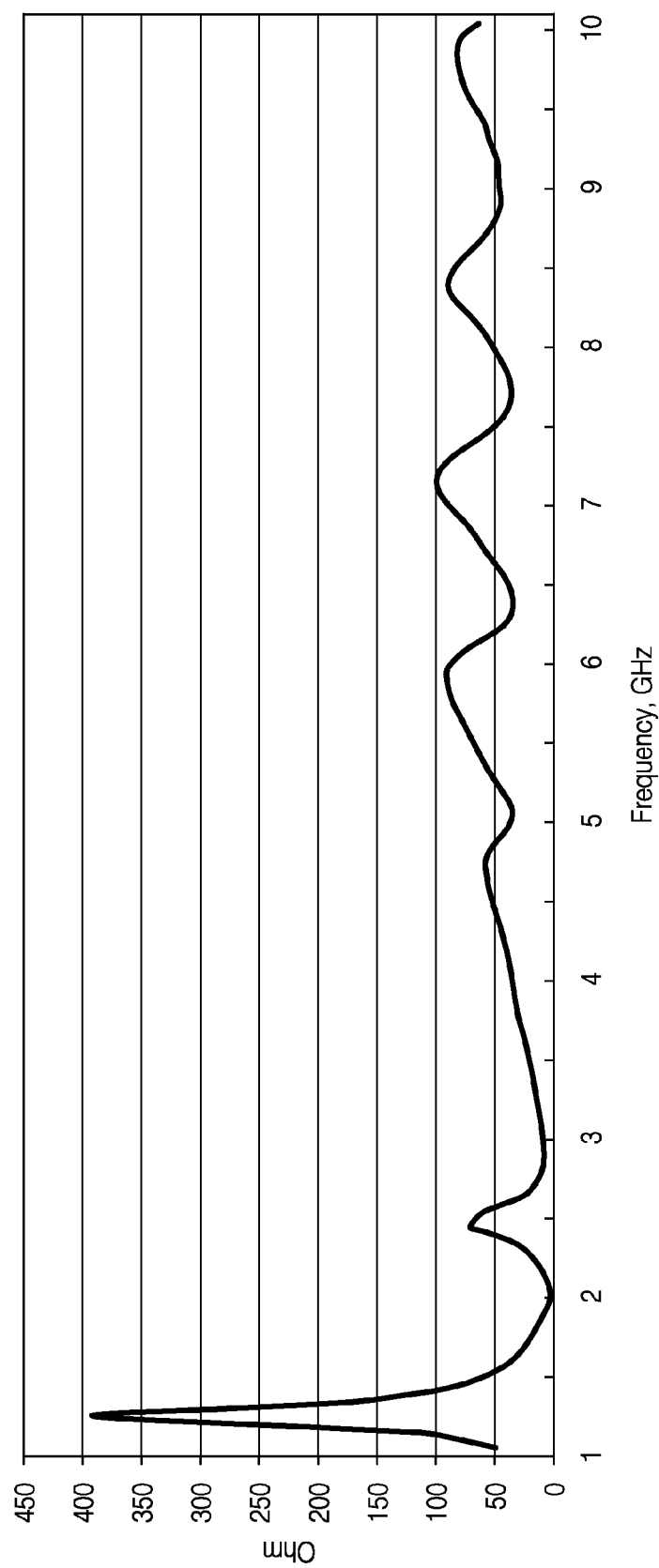
FIG. 15 illustrates a graph showing the simulation results for visible characteristic impedance that is seen by transmitter in transmission link with plated trough hole via using simulation software.

FIG. 15 illustrates a graph showing the simulation results for visible characteristic impedance that is seen by transmitter in transmission link with plated trough hole via using Ansoft HFSS™ simulation software. As shown, the visible characteristic impedance has a huge oscillation up to 400 Ohms in the area of 1-2 GHz that makes impossible to tune ICs I/O buffer.

Figure 16:
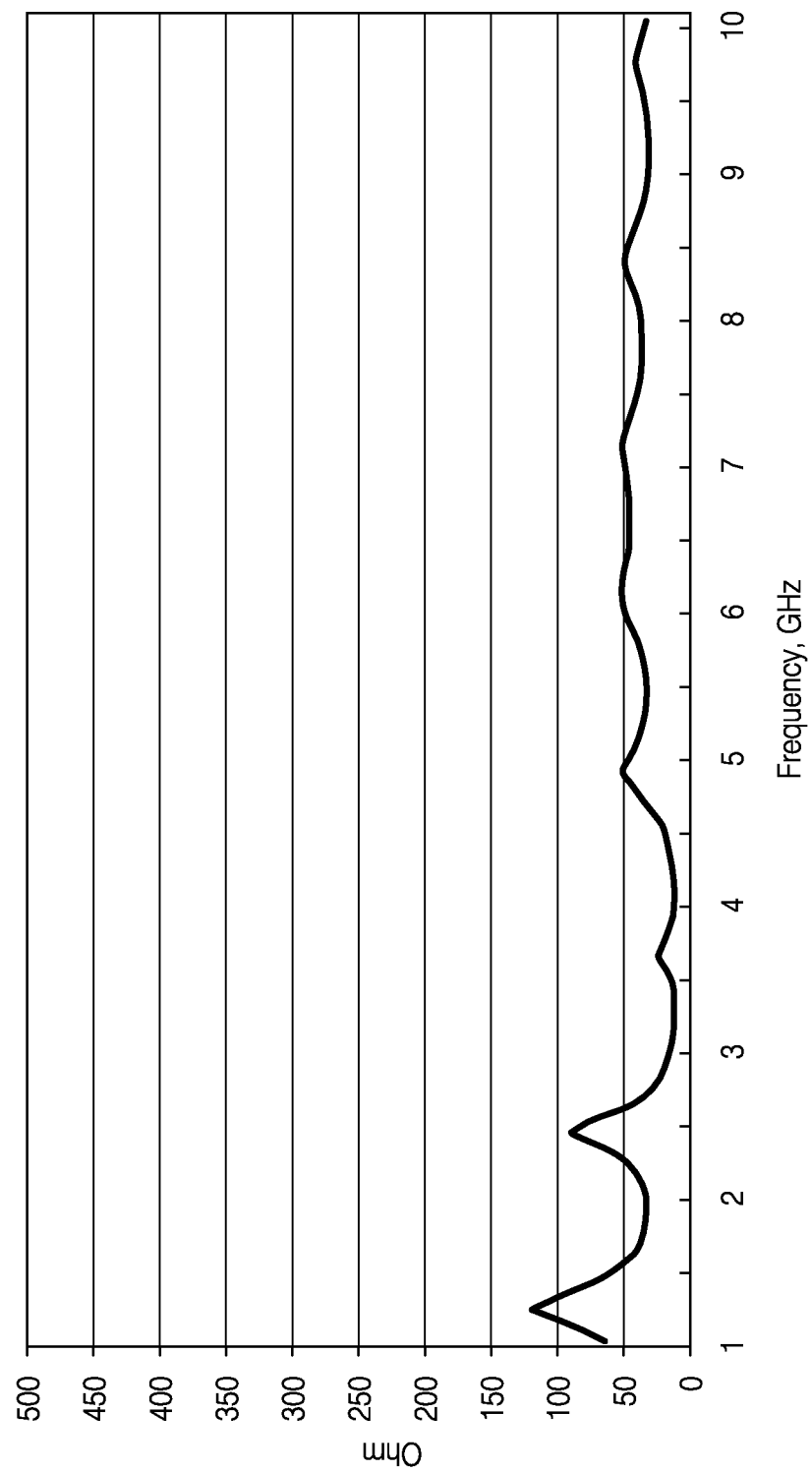
FIG. 16 illustrates a graph showing the simulation of the visible characteristic impedance for transmission link with an EOP element embedded in a via channel.

FIG. 16 illustrates a graph showing the simulation of the visible characteristic impedance for transmission link with an EOP element embedded in a via channel. As shown, the visible characteristic impedance variation may be significantly reduced compared with that of a plated through hole via making it possible and easy to tune ICs I/O transmitter buffers. Furthermore, the Ansoft HFSS™ simulation also shows same behavior for receiver ICs.

Figure 17:
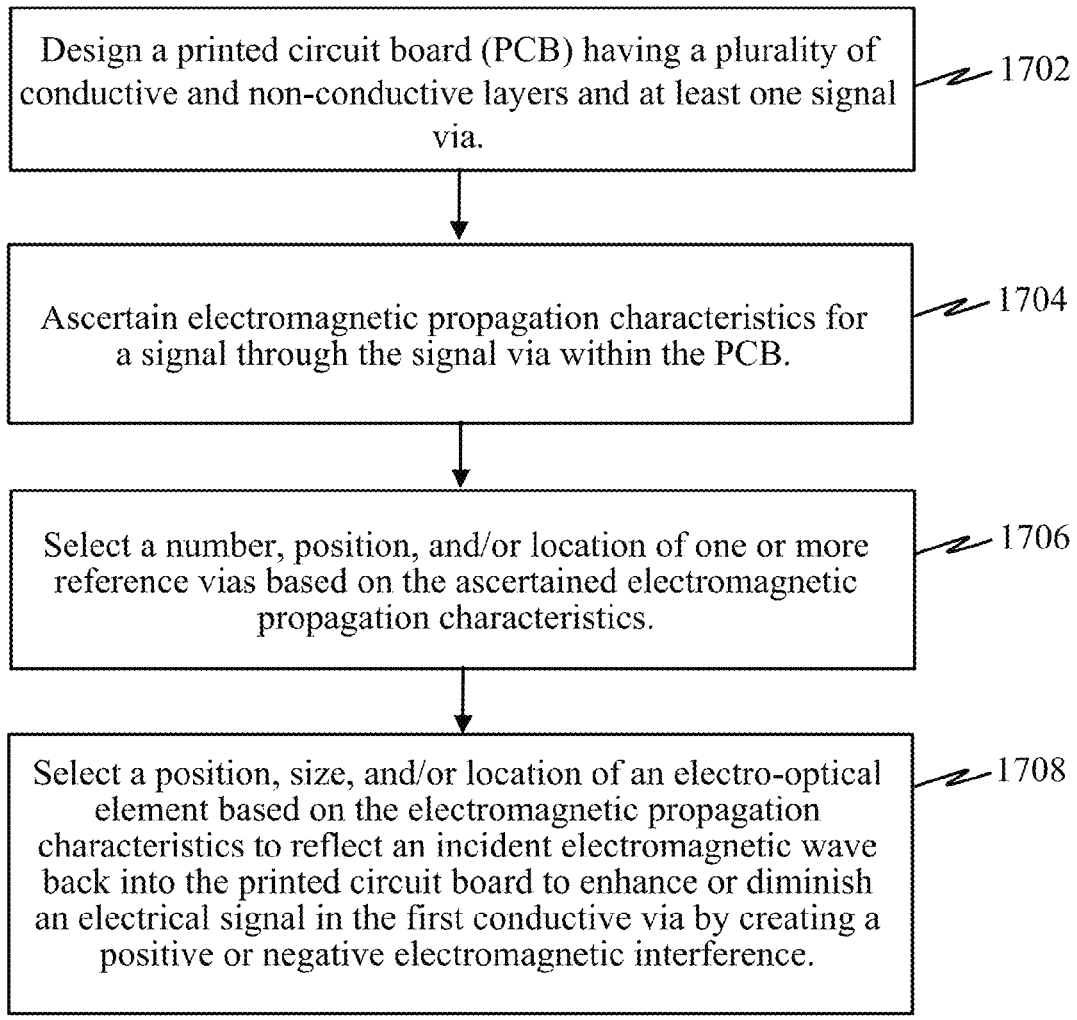
FIG. 17 illustrates a method of forming a printed circuit board with an embedded electro-optical passive element.

FIG. 17 illustrates a method of forming a printed circuit board with an embedded electro-optical passive element. A PCB design is obtained having a plurality of conductive and non-conductive layers and at least one signal via 1702. The electromagnetic propagation characteristics for a signal through the signal via is obtained for the PCB 1704. This may be done by modeling the signal current flow through the signal via (e.g., at one or more frequencies) to ascertain an electromagnetic propagation map. The number, position, and/or location of one or more reference vias is selected based on the ascertained electromagnetic propagation characteristics 1706. Similarly, the distance between the reference via(s) and the signal via may be dictated by the electromagnetic propagation characteristics ascertained. The position, size, and/or location of an electro-optical element is then selected based on the electromagnetic propagation characteristics to reflect an incident electromagnetic wave back into the printed circuit board to enhance or diminish an electrical signal in the first conductive via by creating a positive or negative electromagnetic interference 1708.

One example provides a printed circuit board, comprising a plurality of non-conductive layers with conductive or signal layers in between. A first conductive via is formed traversing the plurality of non-conductive and conductive or signal layers. A second conductive via is formed traversing the plurality of non-conductive layers and conductive or signal layers, the second conductive via located substantially parallel to the first conductive via. An electro-optical passive element is also formed extending perpendicular to and between the first conductive via and the second conductive via, the electro-optical passive element embedded within a selected layer at a first depth in the printed circuit board, wherein such first depth is selected to reflect an incident electromagnetic wave back into the printed circuit board to enhance or diminish an electrical signal in the first conductive via by creating a positive or negative electromagnetic interference.

In one implementation, the first conductive via may be coupled to a first signal trace in a first layer and a second signal trace in a second layer, wherein a source signal flows from the first signal trace into the first conductive via. The first conductive via may be coupled to a signal source at a first layer and the second conductive via is coupled to a second layer, a signal current from the signal source flows through the first conductive via to the second conductive via.

In various examples, at least one of the first conductive via and second conductive via is: (a) an open ended via, a blind via, and/or a back drilled via.

The electro-optical passive element serves to re-direct the signal current through the second conductive via and prevents its propagation to an open end of the first conductive via to inhibit further excitement of an electromagnetic wave beneath a signal layer.

In one instance, the depth at which the electro-optical element is embedded is selected to reflect the incident electromagnetic wave as a reflected electromagnetic wave that negatively interferes with the incident electromagnetic wave to substantially cancel the incident electromagnetic wave.

In another instance, the depth at which the electro-optical element is embedded is selected to reflect the incident electromagnetic wave as a reflected electromagnetic wave that positively interferes with the incident electromagnetic wave to augment the incident electromagnetic wave.

In yet another instance, the depth at which the electro-optical element is embedded is selected to reflect the incident electromagnetic wave as a reflected electromagnetic wave that reduces signal loss.

In still another instance, the depth at which the electro-optical element is embedded is selected to reflect the incident electromagnetic wave as a reflected electromagnetic wave that shifts or removes notches in a frequency response for a transmission path.

The electro-optical element may have a width that is between a diameter of the first conductive via and twice the diameter of the first conductive via.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A printed circuit board, comprising: a plurality of non-conductive layers with conductive or signal layers in between; a first conductive via traversing the plurality of non-conductive and conductive or signal layers; a second conductive via traversing the plurality of non-conductive layers and conductive or signal layers, the second conductive via located substantially parallel to the first conductive via; and a magnetic reflective electrical passive element extending perpendicular to and coupled between and from the first conductive via to the second conductive via, wherein the magnetic reflective electrical passive element is configured and positioned to redirect a source electrical signal through the second conductive via and is embedded within a selected layer at a first depth in the printed circuit board, wherein the first depth, length, and width of the magnetic reflective electrical passive element are selected, based on a characterized electromagnetic propagation of the source electrical signal through at least the first conductive via, to reflect an incident electromagnetic wave to achieve a particular desired positive or negative electromagnetic interference to enhance or diminish the source electrical signal in the first conductive via; the first conductive via is coupled to a first signal trace in a first layer and a second signal trace in a second layer, wherein the source electrical signal flows from the first signal trace into the first conductive via, and the magnetic reflective electrical passive element has a width that is between a diameter of the first conductive via and twice the diameter of the first conductive via.

2. The printed circuit board of claim 1, wherein the first conductive via is coupled to a signal source at a first layer and the second conductive via is coupled to a second layer, a signal current from the signal source flows through the first conductive via to the second conductive via.

3. The printed circuit board of claim 1, wherein at least one of the first conductive via and second conductive via is an open ended via.

4. The printed circuit board of claim 1, wherein at least one of the first conductive via and second conductive via is a back drilled via.

5. The printed circuit board of claim 1, wherein at least one of the first conductive via and second conductive via is a blind via.

6. The printed circuit board of claim 1, wherein the magnetic reflective electrical passive element prevents propagation of the signal current to an open end of the first conductive via to inhibit further excitement of an electromagnetic wave beneath a signal layer.

7. The printed circuit board of claim 1, wherein the depth at which the magnetic reflective electrical passive element is embedded is selected to reflect the incident electromagnetic wave as a reflected electromagnetic wave that negatively interferes with the incident electromagnetic wave to substantially cancel the incident electromagnetic wave.

8. The printed circuit board of claim 1, wherein the depth at which the magnetic reflective electrical passive element is embedded is selected to reflect the incident electromagnetic wave as a reflected electromagnetic wave that positively interferes with the incident electromagnetic wave to augment the incident electromagnetic wave.

9. The printed circuit board of claim 1, wherein the depth at which the magnetic reflective electrical passive element is embedded is selected to reflect the incident electromagnetic wave as a reflected electromagnetic wave that reduces signal loss.

10. The printed circuit board of claim 1, wherein the depth at which the magnetic reflective electrical passive element is embedded is selected to reflect the incident electromagnetic wave as a reflected electromagnetic wave that shifts or removes notches in a frequency response for a transmission path.

11. The printed circuit board of claim 1, wherein the magnetic reflective electrical passive element has a first end and a second end and wherein the first end is electrically connected to the first conducive via and the second end is electrically connected to the second conductive via.

12. The printed circuit board of claim 1, wherein the magnetic reflective electrical passive element remains between the first and second conductive vias.

13. The printed circuit board of claim 1, wherein the magnetic reflective electrical passive element provides an impedance in the range of 0.05 ohms to 1 ohm.

14. The printed circuit board of claim 1, wherein the magnetic reflective electrical passive element provides an impedance in the range of 1 ohm to 5 ohms.

15. The printed circuit board of claim 1, wherein the depth at which the magnetic reflective electrical passive element is embedded is selected to provide a desired value and/or direction of a geometrical sum of electromagnetic vectors associated with incident and reflected electromagnetic waves.

16. The printed circuit board of claim 1, wherein the depth at which the magnetic reflective electrical passive element is embedded is selected to provide constructive interference to increase a total signal strength and compensate for one or more of dielectric and conductor losses at selected frequencies.

17. A method for making a printed circuit board, comprising: forming a plurality of non-conductive layers with conductive or signal layers in between; forming a first conductive via traversing the plurality of non-conductive and conductive or signal layers; forming a second conductive via traversing the plurality of non-conductive layers and conductive or signal layers, the second conductive via located substantially parallel to the first conductive via; and forming a magnetic reflective electrical passive element extending perpendicular to and coupled between and from the first conductive via to the second conductive via, wherein the magnetic reflective electrical passive element is configured and positioned to redirect a source electrical signal through the second conductive via and is embedded within a selected layer at a first depth in the printed circuit board, wherein the first depth, length, and width of the magnetic reflective electrical passive element are selected, based on a characterized electromagnetic propagation of the source signal through at least the first conductive via, to reflect an incident electromagnetic wave to achieve a particular desired positive or negative electromagnetic interference to enhance or diminish the source electrical signal in the first conductive via; the first conductive via is coupled to a first signal trace in a first layer and a second signal trace in a second layer, wherein the source electrical signal flows from the first signal trace into the first conductive via, and the magnetic reflective electrical passive element has a width that is between a diameter of the first conductive via and twice the diameter of the first conductive via.

18. The method of claim 17, wherein the depth at which the magnetic reflective electrical passive element is embedded is selected to reflect the incident electromagnetic wave as a reflected electromagnetic wave that negatively interferes with the incident electromagnetic wave to substantially cancel the incident electromagnetic wave.

19. The method of claim 17, wherein the depth at which the magnetic reflective electrical passive element is embedded is selected to reflect the incident electromagnetic wave as a reflected electromagnetic wave that positively interferes with the incident electromagnetic wave to augment the incident electromagnetic wave.

20. The method of claim 17, wherein the depth at which the magnetic reflective electrical passive element is embedded is selected to reflect the incident electromagnetic wave as a reflected electromagnetic wave that reduces signal loss.

21. The method of claim 17, wherein the depth at which the magnetic reflective electrical passive element is embedded is selected to reflect the incident electromagnetic wave as a reflected electromagnetic wave that shifts or removes notches in a frequency response for a transmission path.

* * * * *